(12) United States Patent
Imura

(10) Patent No.: US 7,479,821 B2
(45) Date of Patent: Jan. 20, 2009

(54) CASCODE CIRCUIT AND SEMICONDUCTOR DEVICE

(75) Inventor: Takashi Imura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 90 days.

(21) Appl. No.: 11/724,940

(22) Filed: Mar. 16, 2007

(65) Prior Publication Data
US 2007/0221996 A1 Sep. 27, 2007

(30) Foreign Application Priority Data
Mar. 27, 2006 (JP) ............... 2006-085728

(51) Int. Cl.
G05F 1/10 (2006.01)
G05F 3/02 (2006.01)

(52) U.S. Cl. ............... 327/538; 327/541; 327/543; 323/315

(58) Field of Classification Search ............ 327/538, 327/541, 543; 323/315
See application file for complete search history.

(56) References Cited

U.S. PATENT DOCUMENTS

| | | | | |
|---|---|---|---|---|
| 4,528,496 A * | 7/1985 | Naokawa et al. | ............ | 323/315 |
| 5,394,079 A * | 2/1995 | Llewellyn | ............ | 323/315 |
| 5,512,815 A * | 4/1996 | Schrader | ............ | 323/315 |
| 5,585,712 A * | 12/1996 | Isham | ............ | 323/315 |
| 5,966,005 A * | 10/1999 | Fujimori | ............ | 323/315 |
| 6,150,871 A * | 11/2000 | Yee | ............ | 327/538 |
| 6,194,887 B1 * | 2/2001 | Tsukada | ............ | 323/315 |
| 6,194,955 B1 * | 2/2001 | Ishida | ............ | 327/538 |
| 6,204,724 B1 * | 3/2001 | Kobatake | ............ | 327/541 |
| 6,348,832 B1 * | 2/2002 | Chih | ............ | 327/538 |
| 6,348,835 B1 * | 2/2002 | Sato et al. | ............ | 327/543 |
| 6,552,603 B2 * | 4/2003 | Ueda | ............ | 327/541 |
| 6,727,744 B2 * | 4/2004 | Nagaya | ............ | 327/540 |
| 6,919,753 B2 * | 7/2005 | Wang et al. | ............ | 327/513 |
| 7,038,530 B2 * | 5/2006 | Chou | ............ | 327/543 |
| 7,142,044 B2 * | 11/2006 | Sano | ............ | 327/540 |
| 7,236,050 B2 * | 6/2007 | Bedarida et al. | ............ | 327/543 |
| 7,265,628 B2 * | 9/2007 | Lloyd et al. | ............ | 330/288 |
| 7,282,989 B2 * | 10/2007 | Byeon | ............ | 327/541 |
| 7,301,322 B2 * | 11/2007 | Choi | ............ | 323/315 |
| 7,372,316 B2 * | 5/2008 | Chatterjee et al. | ............ | 327/513 |
| 7,375,504 B2 * | 5/2008 | Mheen et al. | ............ | 323/315 |
| 2003/0042969 A1 * | 3/2003 | Su et al. | ............ | 327/538 |
| 2005/0218968 A1 * | 10/2005 | Watanabe | ............ | 327/541 |
| 2006/0033557 A1 * | 2/2006 | Toumazou et al. | ............ | 327/541 |
| 2006/0170489 A1 * | 8/2006 | Bedarida et al. | ............ | 327/543 |

(Continued)

Primary Examiner—N. Drew Richards
Assistant Examiner—Adam Houston
(74) Attorney, Agent, or Firm—Brinks Hofer Gilson & Lione

(57) ABSTRACT

A reference voltage circuit having a high power supply rejection ratio, and can operate at low voltage is provided. The reference voltage circuit includes a bias circuit constructed such that a depletion type transistor (3) is connected in series to a power supply voltage supply terminal of a load circuit, an enhancement type MOS transistor (4) for detecting current through the load circuit to operate as a current source is connected to the load circuit, a depletion type MOS transistor (5) is connected in series to the transistor (4), and a gate terminal of the transistor (5) is connected to a source terminal of the transistor (5), in which the gate terminal of the depletion type transistor (3) is connected to the source terminal of the depletion type transistor (5).

19 Claims, 7 Drawing Sheets

U.S. PATENT DOCUMENTS

2007/0210852 A1* 9/2007 Imura ............ 327/333
2007/0290740 A1* 12/2007 Jongsma ............ 327/543
2008/0074173 A1* 3/2008 Tu ............ 327/543

* cited by examiner

CASCODE CIRCUIT AND SEMICONDUCTOR DEVICE

This application claims priority under 35 U.S.C. §119 to Japanese Patent Application No. JP2006-085728 filed Mar. 27, 2006, the entire content of which is hereby incorporated by reference.

BACKGROUND OF THE INVENTION

1. Field of the Invention

The present invention relates to a semiconductor device, and more particularly, to a cascode circuit used for the purpose of decreasing output voltage fluctuations in response to power supply voltage fluctuations.

2. Description of the Related Art

In order to improve the power supply rejection ratio of an analog circuit, a method of adding a cascode circuit is conventionally widely used. Take as an example a reference voltage circuit, which is used to obtain stable output voltage in response to power supply voltage fluctuations and temperature changes. Conventionally, a circuit as illustrated in FIG. 2 of Semiconductor Device for Reference Voltage (Japanese Examined Patent Publication No. Hei 7-74976) is used. FIG. 2 illustrates an equivalent circuit. In the conventional reference voltage circuit, a source terminal of a depletion type MOS transistor 1 and a drain terminal of an enhancement type MOS transistor 2 are connected in series between a power supply voltage supply terminal 101 and a ground potential 100, and respective nodes and their gate terminals are commonly connected. The node is used as a reference voltage output terminal 102 (the electrical circuit such as shown in FIG. 2 will hereinafter be referred to as "a ED type reference voltage circuit 200"). Insofar as the respective transistors operate in a saturation state, even if the voltage of the power supply voltage supply terminal 101 fluctuates, the reference voltage output terminal 102 is not affected by the voltage fluctuations.

However, actually, the voltage of the reference voltage output terminal 102 fluctuates under the influence of channel length modulation effect of the depletion type MOS transistor 1. Accordingly, it is difficult to construct a reference voltage circuit having a high power supply rejection ratio. In order to suppress the channel length modulation effect and to suppress the fluctuations of the power supply voltage within a short period from affecting the reference voltage, a circuit illustrated in FIG. 3 is also used.

In the reference voltage circuit as illustrated in FIG. 3, a depletion type MOS transistor 3 is provided between the reference voltage circuit and a power supply voltage supply terminal 101. In the depletion type MOS transistor 3, a backgate terminal is used as a ground potential, and a bias voltages supply means 201 is connected to the gate terminal.

The depletion type MOS transistor 3 operates as a so-called cascode circuit, and operates so that voltage supplied to the ED type reference voltage circuit 200 becomes constant against the voltage fluctuations of the power supply voltage supply terminal 101. FIG. 1 of Reference Voltage Circuit and Electronic Device (Japanese Patent Application Laid-open No. 2003-295957) illustrates an actual structure of the bias voltage supply means 201. FIG. 4 illustrates a circuit equivalent to FIG. 1 of Japanese Patent Application Laid-open No. 2003-295957.

The circuit is a reference voltage circuit having two channel reference voltage outputs. Paying attention to the ED type reference voltage circuit 200, it can be thought that the depletion type MOS transistor 3, which operates as the cascode circuit is connected to the ED type reference voltage circuit 200, and the depletion type MOS transistor 3 is connected to the bias voltage supply means 201 including a depletion type MOS transistor 6, an enhancement type MOS transistor 7, and a depletion type MOS transistor 8. Similarly, it can be estimated that the depletion type MOS transistor 8 is connected to a bias voltage supply means including the depletion type MOS transistor 1, the enhancement type MOS transistor 2, and the depletion type MOS transistor 3.

In recent years, because mobile devices are widely available and for other reasons, the needs for the realization of a lower power consumption circuit, which can operate for a longer time with a battery of the same capacitance, is increasing. Along with the above circumstances, a reference voltage circuit having a comparable or superior performance to that of that conventional one, and still can operate at lower voltage is advantageous.

In the circuit as illustrated in FIG. 4, when backgate terminals of all the transistors are at the ground potential, consider the lowest operating voltage where no deterioration in the power supply rejection ratio is observed. To this end, all the transistors forming a circuit are required to perform the saturated operation.

In this case, gate-source voltages of the depletion type MOS transistors 3 and 8 each become zero when the characteristics of the two ED type reference voltage circuits are equal, and the characteristics of the depletion type transistors 3 and 8 each operate as a cascode circuit are equal, respectively. Therefore, the lowest operating voltage VDD(min) is expressed as the following equation:

$$V_{DD}(min) = V_{ref} + |V_{T2}(V_{SB2}=V_{ref})| + |V_{T3}(V_{SB3}=V_{ref} + |V_{T2}(V_{SB2}=V_{ref})|)|, \quad \text{(Equation 1)}$$

where $V_{ref}$ is an output voltage of the reference voltage output terminal 102, $V_{T2}(V_{SB2}=V_{ref})$ is a threshold voltage of the enhancement type MOS transistor 2 when the source-backgate voltage is $V_{ref}$, and $V_{T3}(V_{SB3}=V_{ref}+|V_{T2}(V_{SB2}=V_{ref})|)$ is the threshold voltage of the MOS transistor 3 when the source-backgate voltage is $V_{ref}+|V_{T2}(V_{SB2}=V_{ref})|$.

When the power supply voltage becomes lower than $V_{DD}$(min) expressed in Equation 1, the depletion type MOS transistors 3 and 8, which operate as a cascode circuit operate in an unsaturation state, and thus, the output resistance becomes small and the power supply rejection ratio is considerably deteriorated.

SUMMARY OF THE INVENTION

The present invention has been made to solve the above-mentioned problem, and an object of the present invention is to provide a reference voltage circuit and an electronic device using a cascode circuit having a comparable or superior power supply rejection ratio to that of a conventional circuit at lower operating voltage.

In order to attain the above-mentioned object, according to an aspect of the present invention, a reference voltage circuit includes a bias voltage supply means which can apply voltage lower than a gate potential to a source potential of an N-channel depletion type MOS transistor that operates as a cascode circuit, or, which can apply voltage higher than the gate potential to the source potential of a P-channel depletion type MOS transistor that operates as a cascode circuit. By making small the absolute value of the lowest necessary voltage for the saturated operation of the transistor, the lowest operating voltage of a reference voltage circuit can be lowered without deteriorating the power supply rejection ratio.

Further, according to the present invention, there is employed a structure, in which a control current source detects current through a circuit which operates as a load of the cascode circuit, and the current of the control current source is used to determine the bias voltage of the cascode circuit, and thus, bias voltage fluctuations due to variations in the process are suppressed.

The reference voltage circuit according to the present invention can, compared with the conventional circuit, operate at lower power supply voltage without the deterioration of the power supply rejection ratio.

DETAILED DESCRIPTION OF THE PREFERRED EMBODIMENT

Embodiment 1

Figure 1:
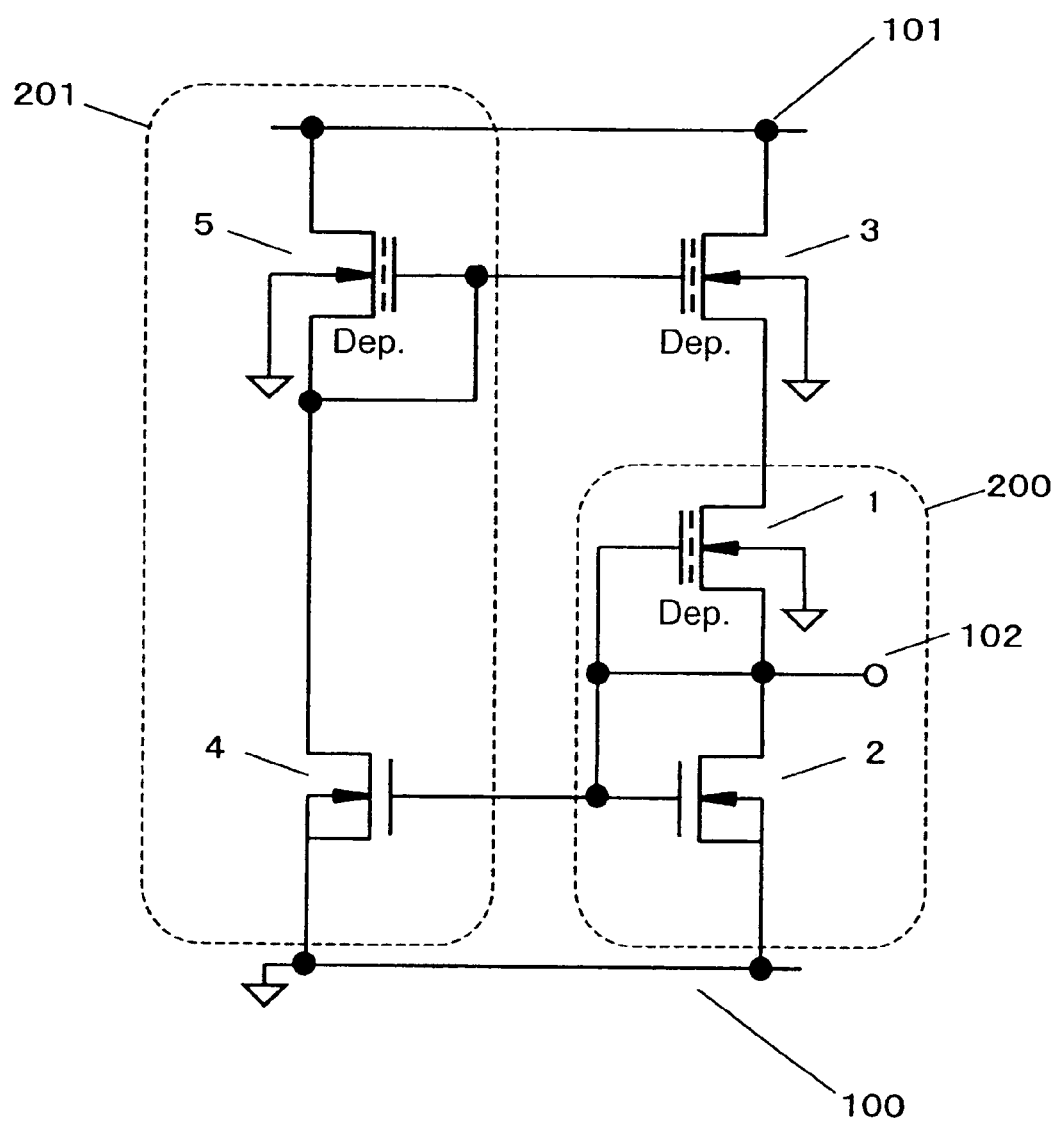
FIG. 1 is a circuit diagram illustrating a first embodiment of a semiconductor device using a cascode circuit according to the present invention.
Figure 2:
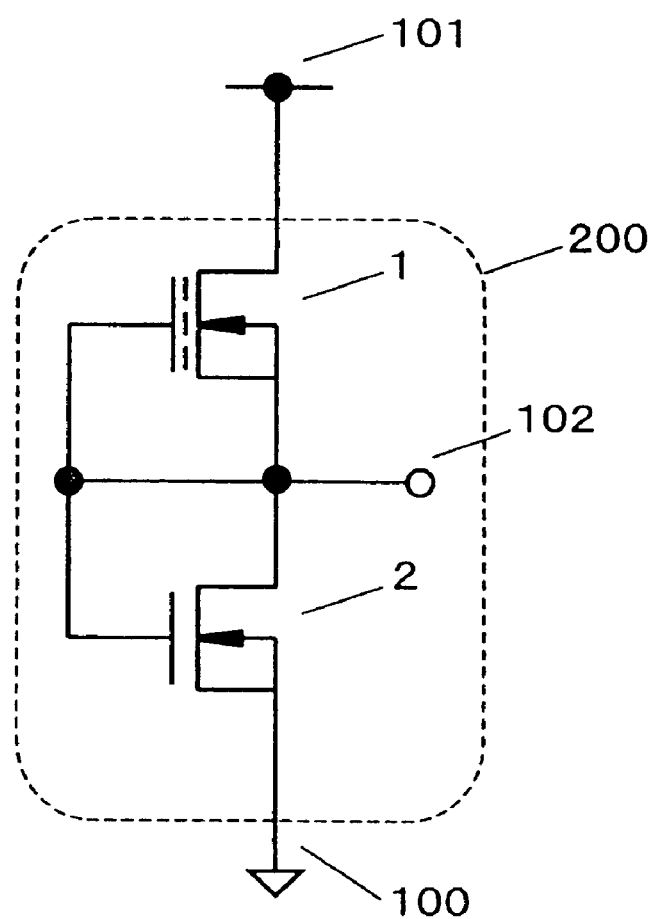
FIG. 2 illustrates an example of the structure of a conventional reference voltage circuit.
Figure 3:
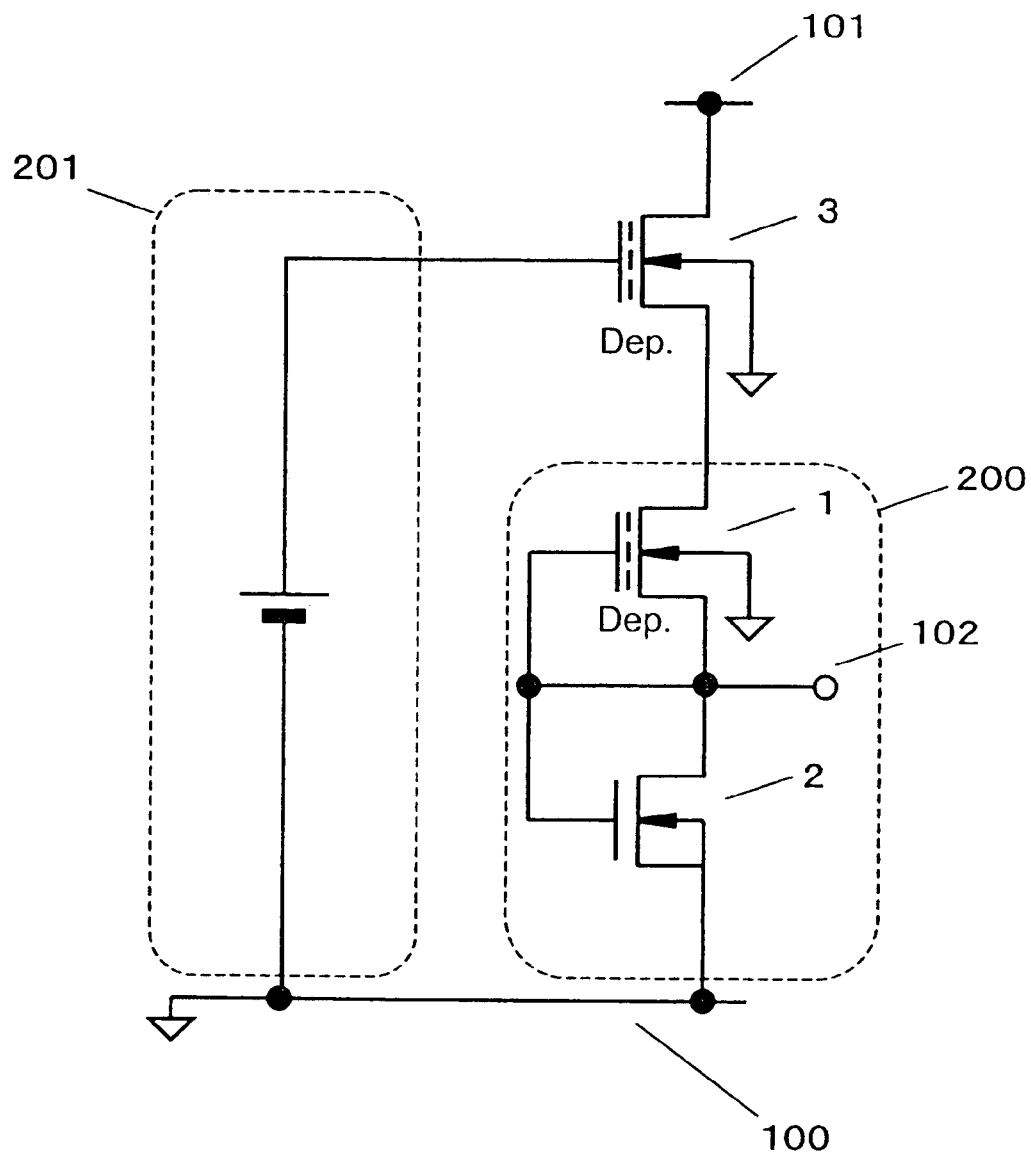
FIG. 3 illustrates an example of the structure of another conventional reference voltage circuit.
Figure 4:
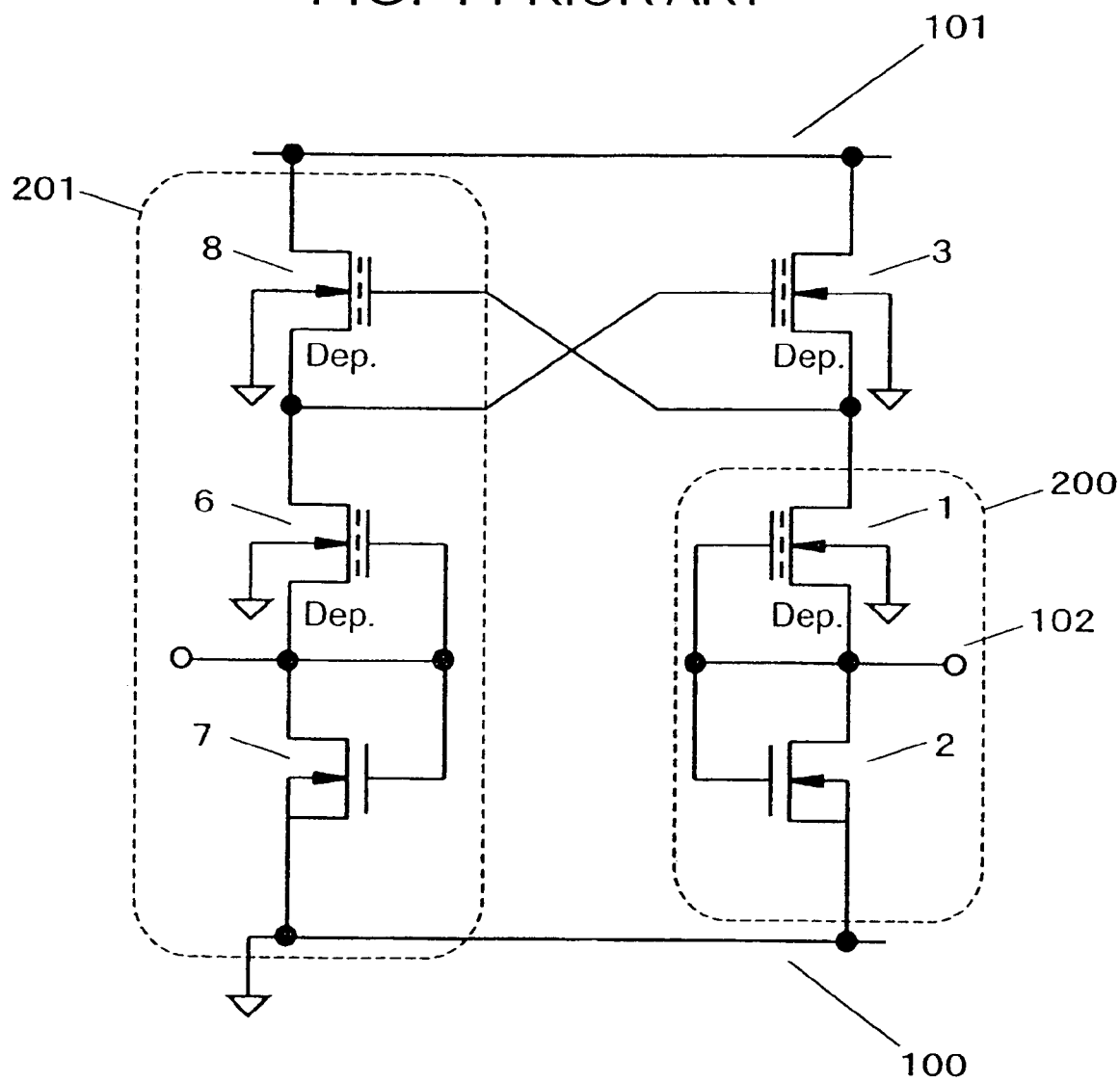
FIG. 4 illustrates an example of the structure of still another conventional reference voltage circuit.

FIG. 1 is a circuit diagram illustrating a first embodiment of a semiconductor device using a cascode circuit according to the present invention. An N-channel depletion type transistor 1 and an N-channel enhancement type MOS transistor 2 forms an ED type reference voltage circuit 200. An N-channel depletion type transistor 3 which operates as a cascode circuit is connected in series to the ED type reference voltage circuit 200. An N-channel enhancement type MOS transistor 4 as a control current source is connected in parallel with the N-channel enhancement type MOS transistor 2. An N-channel depletion type MOS transistor 5 having a gate terminal and a source terminal connected to each other is connected in series to the N-channel enhancement type MOS transistor 4. Further, the source terminal of the N-channel depletion type MOS transistor 5 is connected to a gate terminal of the N-channel depletion type transistor 3. The N-channel enhancement type MOS transistor 4 and the N-channel depletion type MOS transistor 5 form a bias voltage supply means 201 for supplying constant bias voltage to the N-channel depletion type transistor 3, which operates as the cascode circuit.

In the circuit described in the above, when the characteristics and the transconductance coefficients of the N-channel enhancement type MOS transistors 2 and 4, and that of the N-channel depletion type MOS transistors 3 and 5 are the same, the source-backgate voltage—drain current characteristics of the respective depletion type transistors are the same, and the drain currents of the respective depletion type transistors are the same, and thus, the source potentials of the respective depletion type transistors are the same.

Here, by making the transconductance coefficient of the N-channel enhancement type MOS transistor 4 larger than the transconductance coefficient of the N-channel enhancement type MOS transistor 2 by, for example, fixing the L length and making larger the W length, the source potential of the MOS transistor 5 can be made lower than the source potential of the N-channel depletion type MOS transistor 3.

Specifically, by making the transconductance coefficient of the N-channel depletion type MOS transistor 5 smaller than the transconductance coefficient of the N-channel depletion type MOS transistor 3, the source potential of the N-channel depletion type MOS transistor 5 can be made lower than the source potential of the N-channel depletion type MOS transistor 3.

Alternatively, by implementing both of the above, the source potential of the N-channel depletion type MOS transistor 5 can be made lower than the source potential of the N-channel depletion type MOS transistor 3.

In the structure as described in the above, the lowest operating voltage $V_{DD}(\min)$ is expressed as the following equation:

$$V_{DD}(\min)=V_{ref}+|V_{T2}(V_{SB2}=V_{ref})|+|V_{T3}(V_{SB3}=V_{ref}+|V_{T2}(V_{SB2}=V_{ref})|)|+V_{gs3}, \quad \text{(Equation 2)}$$

where $V_{ref}$ is an output voltage of the reference voltage output terminal 102, $V_{T2}(V_{SB2}=V_{ref})$ is a threshold voltage of the enhancement type MOS transistor 2 when the source-backgate voltage is $V_{ref}$, $V_{T3}(V_{SB3}=V_{ref}+|V_{T2}(V_{SB2}=V_{ref})|)$ is a threshold voltage of the MOS transistor 3 when the source-backgate voltage is $V_{ref}+|V_{T2}(V_{SB2}=V_{ref})|$, and $V_{gs3}$ is a gate-source voltage of the MOS transistor 3.

In this case, because the source potential of the MOS transistor 5 is lower than the source potential of the N-channel depletion type MOS transistor 3, $V_{gs3}<0$, and thus, the lowest operating voltage $V_{DD}(\min)$ can be made lower than that of a conventional configuration.

Figure 5:
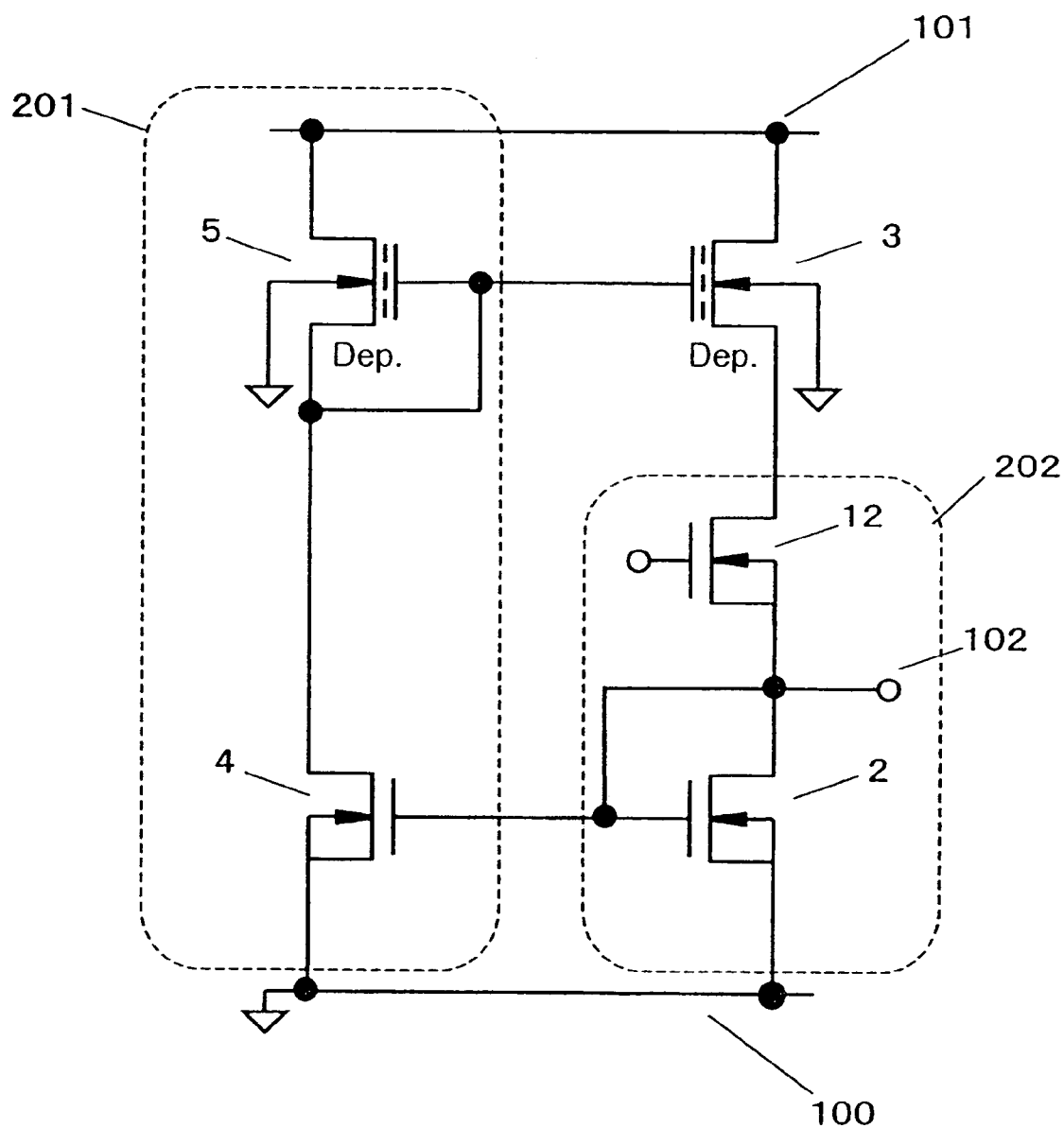
FIG. 5 is a circuit diagram illustrating the first embodiment of the semiconductor device using a cascode circuit according to the present invention.

Further, by using the cascode circuit according to the present invention as a source follower circuit as illustrated in FIG. 5 in addition to using as the reference voltage circuit in FIG. 1, similar effects can be obtained.

Embodiment 2

Figure 6:
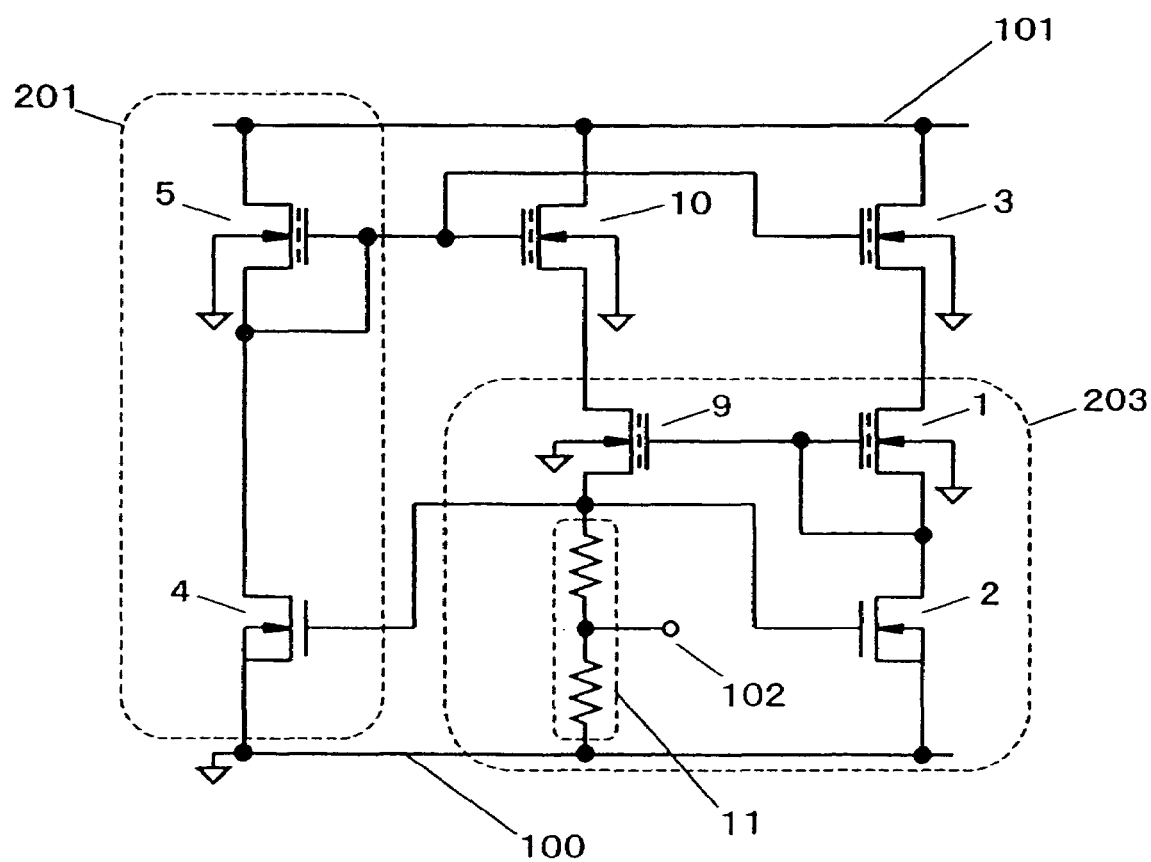
FIG. 6 is a circuit diagram illustrating a second embodiment of a semiconductor device using a cascode circuit according to the present invention.

FIG. 6 is a circuit diagram illustrating a second embodiment of a semiconductor device using a cascode circuit according to the present invention.

The circuit is structured such that N-channel depletion type transistors 10 and 3 which operate as cascode circuits are connected to an ED type reference voltage circuit 203 including an N-channel depletion type transistor 1, an N-channel depletion type transistor 9, an N-channel enhancement type MOS transistor 2, and a group of resistances 11.

An N-channel enhancement type MOS transistor 4 as a control current source is connected in parallel with the group of resistances 11. Further, An N-channel depletion type MOS transistor 5 having a gate terminal connected to a source terminal thereof is connected in series to the N-channel enhancement type MOS transistor 4.

Further, the source terminal of the N-channel depletion type MOS transistor 5 is connected to gate terminals of the N-channel depletion type transistors 10 and 3, and the N-channel enhancement type MOS transistor 4 and the N-channel depletion type MOS transistor 5 form a bias voltage supply means 201 for supplying constant bias voltage to the N-channel depletion type transistors 10 and 3 which operate as the cascode circuits.

In this circuit, also, by making the transconductance coefficient of the N-channel depletion type MOS transistor 5 smaller than the transconductance coefficient of the N-channel depletion type MOS transistor 3, the source potential of the N-channel depletion type MOS transistor 5 can be made lower than the source potential of the N-channel depletion type MOS transistor 3. In this construction, similarly to the case of Embodiment 1, the lowest operating voltage $V_{DD}$ (min) is expressed as Equation 2. Because the source potential of the MOS transistor 5 is lower than the source potential of the N-channel depletion type MOS transistor 3, $V_{gs3}<0$, and thus, the lowest operating voltage $V_{DD}$(min) can be made lower than that of a conventional configuration.

With regard to the relationship between transconductance coefficients of the transistors, constructions similar to those described in the first embodiment can obtain similar effects.

Embodiment 3

Figure 7:
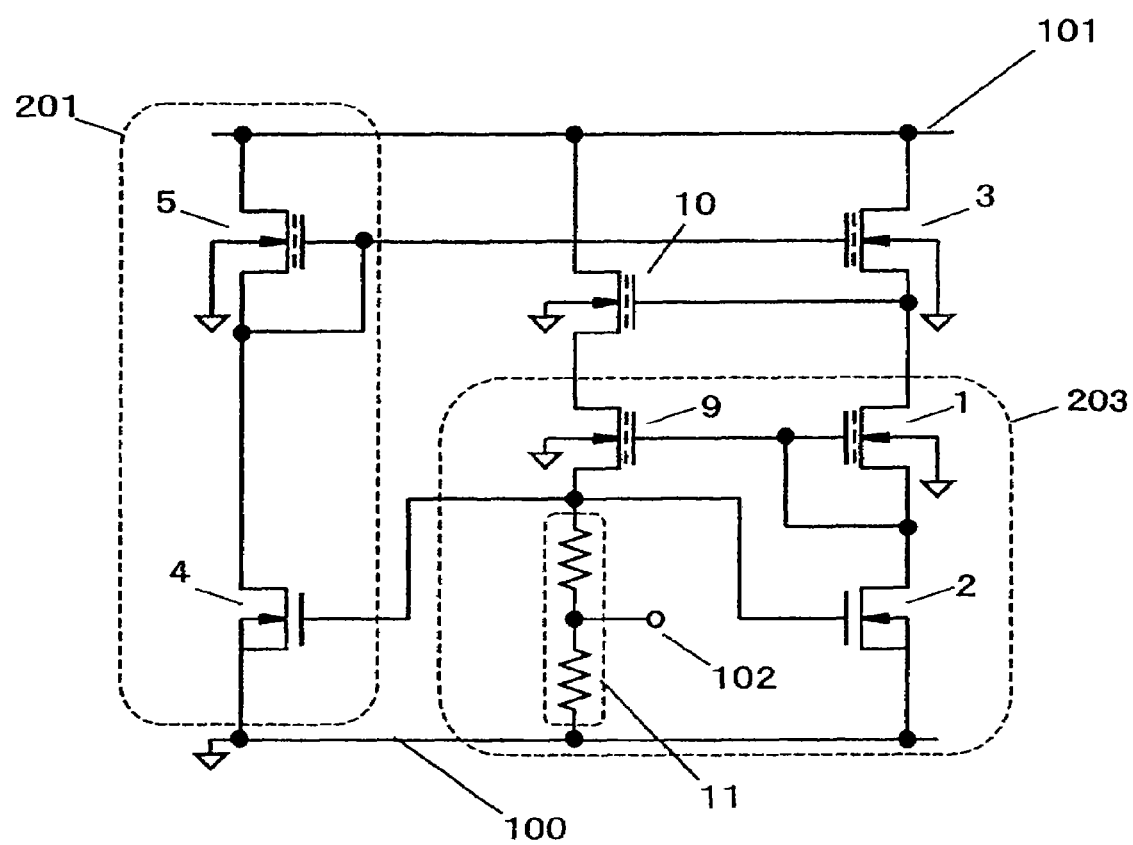
FIG. 7 is a circuit diagram illustrating a third embodiment of a semiconductor device using a cascode circuit according to the present invention.

FIG. 7 is a circuit diagram illustrating a third embodiment of a semiconductor device using a cascode circuit according to the present invention.

Similarly to the case of the second embodiment, the circuit is constructed such that an N-channel depletion type transistor 3 which operates as a cascode circuit is connected to an ED type reference voltage circuit 203 including an N-channel depletion type transistor 1, an N-channel depletion type transistor 9, an N-channel enhancement type MOS transistor 2, and a group of resistances 11, and a gate of an N-channel depletion type transistor 10 which operates as a cascode circuit is connected to a source terminal of the N-channel depletion type transistor 3.

An N-channel enhancement type MOS transistor 4 as a control current source is connected in parallel with the group of resistances 11. Further, An N-channel depletion type MOS transistor 5 having a gate terminal connected to a source terminal thereof is connected in series to the N-channel enhancement type MOS transistor 4.

Further, the source terminal of the N-channel depletion type MOS transistor 5 is connected to a gate terminal of the N-channel depletion type MOS transistor 3, and the N-channel enhancement type MOS transistor 4 and the N-channel depletion type MOS transistor 5 form a bias voltage supply means 201 for supplying constant bias voltage to the N-channel depletion type transistor 3 which operates as the cascode circuit.

In this circuit, also, by making the transconductance coefficient of the N-channel depletion type MOS transistor 5 smaller than the transconductance coefficient of the N-channel depletion type MOS transistor 3, the source potential of the N-channel depletion type MOS transistor 5 can be made lower than the source potential of the N-channel depletion type MOS transistor 3. In this construction, similarly to the case of Embodiment 1, the lowest operating voltage VDD (min) is expressed as Equation 2. Because the source potential of the MOS transistor 5 is lower than the source potential of the N-channel depletion type MOS transistor 3, $V_{gs3}<0$, and thus, the lowest operating voltage $V_{DD}$(min) can be made lower than that of a conventional configuration.

What is claimed is:

1. A cascode circuit comprising:
   a first N-channel depletion type MOS transistor having a source and a gate connected to each other;
   a second N-channel depletion type MOS transistor having a gate connected to the gate of the first N-channel depletion type MOS transistor, for supplying power to a load circuit connected to a source of the second N-channel depletion type MOS transistor; and
   a control current source connected to the source of the first N-channel depletion type MOS transistor, the control current source being controlled by current through the load circuit, wherein
   the drain-source voltage of the first N-channel depletion type MOS transistor is set to be higher than threshold voltage, and the substrate potential is set to be lower than source potential of the first N-channel depletion type MOS transistor, and
   the drain-source voltage of the second N-channel depletion type MOS transistor is set to be higher than threshold voltage, and the substrate potential is set to be lower than source potential of the second N-channel depletion type MOS transistor.

2. A cascode circuit according to claim 1, wherein the substrate potential of the first N-channel depletion type MOS transistor and the substrate potential of the second N-channel depletion type MOS transistor are grounded.

3. A cascode circuit according to claim 1, wherein the control current source comprises a first N-channel enhancement type MOS transistor having a gate connected to the load circuit and having a drain connected to the source of the first N-channel depletion type MOS transistor.

4. A semiconductor device comprising the cascode circuit according to claim 3, wherein the load circuit is a reference voltage circuit comprising:
   a third N-channel depletion type MOS transistor having a drain connected to the source of the second N-channel depletion type MOS transistor and having a source and a gate connected to the gate of the first N-channel enhancement type type MOS transistor; and
   a second N-channel enhancement type MOS transistor having a drain and a gate connected to the source of the third N-channel depletion type MOS transistor.

5. A semiconductor device comprising the cascode circuit according to claim 3, wherein the load circuit is a source follower circuit comprising:
   a third N-channel enhancement type MOS transistor having a drain connected to the source of the second N-channel depletion type MOS transistor; and
   a second N-channel enhancement type MOS transistor having a drain and a gate connected to the source of the third N-channel enhancement type MOS transistor and to the gate of the first N-channel enhancement type MOS transistor.

6. A semiconductor device according to claim 4, wherein the transconductance coefficient of the first N-channel enhancement type MOS transistor is made larger than the transconductance coefficient of the second N-channel enhancement type MOS transistor.

7. A semiconductor device according to claim 4, wherein the transconductance coefficient of the first N-channel depletion type MOS transistor is made smaller than the transconductance coefficient of the second N-channel depletion type MOS transistor.

8. A semiconductor device according to claim 4, wherein
   the transconductance coefficient of the first N-channel enhancement type MOS transistor is made larger than the transconductance coefficient of the second N-channel enhancement type MOS transistor, and
   the transconductance coefficient of the first N-channel depletion type MOS transistor is made smaller than the transconductance coefficient of the second N-channel depletion type MOS transistor.

9. A semiconductor device according to claim 5, wherein the transconductance coefficient of the first N-channel enhancement type MOS transistor is made larger than the transconductance coefficient of the second N-channel enhancement type MOS transistor.

10. A semiconductor device according to claim 5, wherein the transconductance coefficient of the first N-channel depletion type MOS transistor is made smaller than the transconductance coefficient of the second N-channel depletion type MOS transistor.

11. A semiconductor device according to claim 5, wherein
the transconductance coefficient of the first N-channel enhancement type MOS transistor is made larger than the transconductance coefficient of the second N-channel enhancement type MOS transistor, and
the transconductance coefficient of the first N-channel depletion type MOS transistor is made smaller than the transconductance coefficient of the second N-channel depletion type MOS transistor.

12. A semiconductor device comprising a cascode circuit, the cascode circuit comprising:
a first N-channel depletion type MOS transistor having a source and a gate connected to each other;
a second N-channel depletion type MOS transistor having a gate connected to the gate of the first N-channel depletion type MOS transistor;
a third N-channel depletion type MOS transistor having a drain connected to a source of the second N-channel depletion type MOS transistor, and having a source and a gate connected to each other;
a second N-channel enhancement type MOS transistor having a drain connected to the source of the third N-channel depletion type MOS transistor;
a first N-channel enhancement type MOS transistor having a drain connected to the source of the first N-channel depletion type MOS transistor;
a fourth N-channel depletion type MOS transistor having a gate connected to the gate of the first N-channel depletion type MOS transistor;
a fifth N-channel depletion type MOS transistor having a drain connected to a source of the fourth N-channel depletion type MOS transistor, and having a gate connected to the source of the third N-channel depletion type MOS transistor; and
a plurality of serially connected resistances connected to the gates of the first and second N-channel enhancement type MOS transistors and to a source of the fifth N-channel depletion type MOS transistor, wherein
the cascode circuit is constructed such that positive constant voltage is output from an arbitrary point of connection of the plurality of serially connected resistances, and
substrate potentials of all the MOS transistors are grounded.

13. A semiconductor device according to claim 12, wherein the transconductance coefficient of the first N-channel enhancement type MOS transistor is made larger than the transconductance coefficient of the second N-channel enhancement type MOS transistor.

14. A semiconductor device according to claim 12, wherein the transconductance coefficient of the first N-channel depletion type MOS transistor is made smaller than the transconductance coefficient of the second N-channel depletion type MOS transistor.

15. A semiconductor device according to claim 12, wherein
the transconductance coefficient of the first N-channel enhancement type MOS transistor is made larger than the transconductance coefficient of the second N-channel enhancement type MOS transistor, and
the transconductance coefficient of the first N-channel depletion type MOS transistor is made smaller than the transconductance coefficient of the second N-channel depletion type MOS transistor.

16. A semiconductor device comprising a cascode circuit, the cascode circuit comprising:
a first N-channel depletion type MOS transistor having a source and a gate connected to each other;
a second N-channel depletion type MOS transistor having a gate connected to the gate of the first N-channel depletion type MOS transistor;
a third N-channel depletion type MOS transistor having a drain connected to a source of the second N-channel depletion type MOS transistor, and having a source and a gate connected to each other;
a second N-channel enhancement type MOS transistor having a drain connected to the source of the third N-channel depletion type MOS transistor;
a first N-channel enhancement type MOS transistor having a drain connected to the source of the first N-channel depletion type MOS transistor;
a fourth N-channel depletion type MOS transistor having a gate connected to the gate of the second N-channel depletion type MOS transistor;
a fifth N-channel depletion type MOS transistor having a drain connected to a source of the fourth N-channel depletion type MOS transistor, and having a gate connected to the source of the third N-channel depletion type MOS transistor; and
a plurality of serially connected resistances connected to the gates of the first and second N-channel enhancement type MOS transistors and to a source of the fifth N-channel depletion type MOS transistor, wherein
the cascode circuit is constructed such that positive constant voltage is output from an arbitrary point of connection of the plurality of serially connected resistances, and
substrate potentials of all the MOS transistors are grounded.

17. A semiconductor device according to claim 16, wherein the transconductance coefficient of the first N-channel enhancement type MOS transistor is made larger than the transconductance coefficient of the second N-channel enhancement type MOS transistor.

18. A semiconductor device according to claim 16, wherein the transconductance coefficient of the first N-channel depletion type MOS transistor is made smaller than the transconductance coefficient of the second N-channel depletion type MOS transistor.

19. A semiconductor device according to claim 16, wherein
the transconductance coefficient of the first N-channel enhancement type MOS transistor is made larger than the transconductance coefficient of the second N-channel enhancement type MOS transistor, and
the transconductance coefficient of the first N-channel depletion type MOS transistor is made smaller than the transconductance coefficient of the second N-channel depletion type MOS transistor.

* * * * *